(12) United States Patent
Hauser (10) Patent No.: US 6,753,594 B2
(45) Date of Patent: Jun. 22, 2004

(54) ELECTRONIC COMPONENT WITH A SEMICONDUCTOR CHIP AND FABRICATION METHOD

(75) Inventor: Christian Hauser, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/226,061

(22) Filed: Aug. 22, 2002

(65) Prior Publication Data

US 2003/0038352 A1 Feb. 27, 2003

(30) Foreign Application Priority Data

Aug. 22, 2001 (DE) .......................................... 101 39 985

(51) Int. Cl.⁷ ........................ H01L 23/04; H01L 23/495
(52) U.S. Cl. ...................... 257/668; 257/786; 257/698; 257/676; 257/779; 257/784; 257/691; 438/123; 438/124
(58) Field of Search ................................ 257/123, 124, 257/691, 784, 779, 676, 698, 668, 786

(56) References Cited

U.S. PATENT DOCUMENTS

| | | | |
|---|---|---|---|
| 5,473,198 A | 12/1995 | Hagiya et al. | |
| 5,920,115 A | * 7/1999 | Kimura et al. | ............... 257/668 |
| 6,054,767 A | 4/2000 | Chia et al. | |
| 6,081,429 A | 6/2000 | Barrett | |
| 6,210,992 B1 | 4/2001 | Tandy et al. | |
| 6,429,528 B1 | * 8/2002 | King et al. | ................. 257/775 |

FOREIGN PATENT DOCUMENTS

| | | |
|---|---|---|
| DE | 100 03 670 A1 | 8/2001 |
| EP | 0 903 780 A2 | 3/1999 |
| JP | 2001 110 937 A | 4/2001 |

OTHER PUBLICATIONS

Anonymous: "Face–down chip mounting process employing wire–bond connections to allow use of conventional assembly line", *Research Disclosure RD408010–A*, Mar. 20, 1998, http://mhpa5xzc.mch.sbs.de/HTML/250244.html.

* cited by examiner

*Primary Examiner*—Jerome Jackson
(74) *Attorney, Agent, or Firm*—Laurence A. Greenberg; Werner H. Stemer; Ralph E. Locher (57) ABSTRACT

The invention relates to an electronic component with a semiconductor chip and a rewiring plate including a bond channel for bond connections between contact surfaces of the semiconductor chip and contact terminal pads on the rewiring plate. The contact surfaces extend in two parallel rows in a first portion and in one row in at least one other portion. A method for fabricating the inventive electronic component is also described.

25 Claims, 5 Drawing Sheets

ELECTRONIC COMPONENT WITH A SEMICONDUCTOR CHIP AND FABRICATION METHOD

BACKGROUND OF THE INVENTION

Field of the Invention

The present invention relates to an electronic component with a semiconductor chip and a method for fabricating the electronic component.

In the fabrication of electronic components with semiconductor chips, rewiring plates are often employed, which are glued onto the active surface of the semiconductor chip such that a through-hole remains clear. The through-hole serves for providing a bond channel, so that after the gluing process, bond wires can be bonded from contact surfaces on the semiconductor chip to contact terminal pads on the rewiring plate. After the bond connections are glued and attached, the bond channel (i.e. the through-hole in the rewiring plate) is covered with a plastic compound.

As miniaturization of the semiconductor chips progresses and integration increases, the number of contact surfaces on the chip tends to rise. But the component size should not grow as chips become smaller. Therefore, the density of interconnects per area on the rewiring plate increases. In order to accommodate more contact terminal pads in the bond channel, they can be configured in two or more rows, although this requires a wider bond channel and thus reduces the area available for the rewiring tracks.

SUMMARY OF THE INVENTION

It is accordingly an object of the invention to provide an electronic component with a semiconductor chip and a method for producing the electronic component which overcome the above-mentioned disadvantages of the prior art apparatus and methods of this general type.

In particular, it is an object of the invention to design an electronic component with a semiconductor chip that makes it possible to produce reliable bond connections in order to overcome the disadvantages of the prior art.

With the foregoing and other objects in view there is provided, in accordance with the invention, a method for fabricating an electronic component, which includes steps of: providing a semiconductor chip having an active front side with semiconductor structures and contact surfaces configured such that a first portion of the contact surfaces extend in two parallel rows, and at least a second portion of the contact surfaces extend in one row; providing a rewiring plate with an oblong through-hole forming a bond channel and with a rewiring plane facing away from the semiconductor chip; providing the rewiring plane with contact terminal pads, rewiring lines, and external contact surfaces; fastening the semiconductor chip on the rewiring plate, such that the contact surfaces of the semiconductor chip are positioned in the through-hole of the rewiring plate; producing bond connections between the contact surfaces on the semiconductor chip and the contact terminal pads on the rewiring plate; and filling the through-hole with a plastic compound to embed the bond connections.

In accordance with an added mode of the invention, the method includes steps of: providing the bond connections with bond wires that cross longitudinal sides of the through-hole and providing the bond wires with approximately uniform wire lengths.

With the foregoing and other objects in view there is also provided, in accordance with the invention, an electronic component, including: a semiconductor chip having an active front side with semiconductor structures and contact surfaces; a rewiring plate having a rewiring plane with contact terminal pads; and bond connections between the contact surfaces on the active front side and the contact terminal pads. The rewiring plane faces away from the semiconductor chip. The active front side of the semiconductor chip is fastened on the rewiring plate. The rewiring plate is formed with an oblong through-hole for receiving the bond connections. The through-hole has a first portion in which the contact surfaces extend in two parallel rows. The through-hole has at least one additional portion, for example, a second portion in which the contact surfaces extend one row.

This configuration of contact surfaces makes possible a partly narrowed contour of the through-hole and thus makes more space available at the narrowed locations for terminal pads of the rewiring plane.

In a first embodiment of the invention, the contact surfaces are arranged in two parallel rows in a central first portion and in only one row in peripheral second and third portions, respectively.

In the center first region of the through-hole, the contact surfaces of the semiconductor chip extend in two parallel rows, because more space is available on the rewiring plate for contact terminal pads. In contrast, in the peripheral second and third portions, the contact surfaces extend in only one row, because here there tends to be less space available for contact terminal pads. The contact terminal pads in electrical contact with the contact surfaces extending in second and third portions thus have sufficient space in this configuration.

In an alternative embodiment of the invention, the contact surfaces are arranged in one row in the central first portion and in two parallel rows in the peripheral second and third portions, respectively.

This way, there is less space available on the rewiring plate for contact terminal pads in the peripheral second and third portions, where the contact surfaces of the semiconductor chip extend in two parallel rows. On the other hand, in this embodiment the contact surfaces extend in only one row in the middle first portion, so that more space is available for contact terminal pads at this location. The contact terminal pads which are in electrical contact with the contact surfaces extending in the first portion therefore have sufficient space in this configuration.

An inventive embodiment provides that the semiconductor chip includes edge sides and a back side opposite the active front side. It is further provided that the contact surfaces on the active front side have a structure and configuration to which the through-hole of the rewiring plate is adapted.

This inventive embodiment has the advantage that, in the peripheral regions, sufficient area remains between the through-hole and external contacts, such that conductive tracks of the rewiring structure can be led between them.

According to another embodiment of the invention, the contact surfaces on the semiconductor chip are electrically connected to contact terminal pads on the rewiring plate by bond connections, and the contact terminal pads are electrically connected by rewiring lines and external contact surfaces of the electronic component.

The particular advantage of this embodiment is that fast and inexpensive electrical connections can be produced by using the bond connections. The through-hole in the rewiring plate is advantageously a bond channel.

According to another embodiment of the invention, the through-hole in the rewiring plate has an oblong contour. A central first region of the through-hole corresponds to the contact surfaces that are arranged in the central first portion, and peripheral second and third regions of the through-hole respectively correspond to the contact surfaces arranged in the second and third portions. It is further provided that the through-hole has a narrowed contour in the second and third regions compared to its contour in the first region.

The advantage of this embodiment is that sufficient space is available for the rewiring structure that is arranged on the rewiring plate between contact terminal pads and the external contacts. The contact terminal pads can thus be constructed large enough that reliable bond connections can always be installed on them.

In another inventive embodiment, the bond connections including bond wires on the long sides of the through-hole have approximately uniform wire lengths, which advantageously enables rapid and reliable bonding. The approximately equal bond wire lengths also guarantee an approximately uniform height of the bond connections and thus a sufficiently flat electronic component.

According to an inventive embodiment, the contact terminal pads respectively adjoin the long sides of the through-hole and have approximately equal area dimensions. This guarantees a reliable bond connection on any contact terminal pad at any time.

A typical rewiring plate thickness is between 150 $\mu$m and 300 $\mu$m. The purpose of the rewiring plate is to transmit electrical signals and to supply currents of the semiconductor chip from the microscopic contact terminal pads to macroscopic external contact surfaces via conductive tracks. In this context, the term "microscopic dimensions" refers to structures that can be measured only under a light microscope, and the term "macroscopic" refers to structures that can be recognized with the naked eye.

According to another embodiment of the invention, the rewiring plate includes a fiber-reinforced plastic plate with a metal laminate that is structured into contact terminal pads, rewiring lines, and external contact surfaces. The fiber reinforcement gives this embodiment the advantage that, when packaging the electronic component in a plastic housing, the rewiring plate retains its dimensional stability and can therefore withstand the high injection pressure. This injection pressure is in the order of between 8 MPa and 15 MPa. The structured metal laminate is installed on the bottom side of the rewiring plate and is protected from metallization during the soldering of the external contacts by a solder resist layer. Only the external contact surfaces are kept clear of both the solder resist and the plastic compound until the external contacts are installed.

In another embodiment of the invention, the metal laminate consists of copper or a copper alloy. The advantage of this is that the metal laminate can be galvanically applied on the fiber-reinforced plastic of the rewiring plate, and copper represents a relatively inexpensive metal laminate relative to the material costs.

Because copper surfaces oxidize easily and are therefore suitable for neither bonding nor soldering, the contact terminal pads on which bond connections will be produced and the external contact surfaces onto which the external contacts will be soldered are respectively furnished with a bondable or solderable coating in another embodiment of the invention.

The inventive method for fabricating one of the above described embodiments of the above described electronic component includes the following steps: A first semiconductor chip is provided with contact surfaces on an active front side. A rewiring plate is provided with an oblong through-hole that forms a bond channel, and with a rewiring plane consisting of contact terminal pads, rewiring lines and external contact surfaces. The semiconductor chip is fastened on the rewiring plate such that the contact surfaces of the semiconductor chip are positioned in the through-hole of the rewiring plate. Bond connections are then produced between the contact surfaces on the semiconductor chip and the contact terminal pads on the rewiring plate. Lastly, the through-hole is filled with a plastic compound, embedding the bond connections.

The particular advantage of this inventive method is that compact electronic components can be reliably produced using the method.

According to an embodiment of the inventive method, an approximately uniform wire length is maintained in the installation of the bond connections with the bond wires on the long sides of the through-hole. This is associated with the advantage that stable and flat bond connections can be produced, which results in a flat electronic component.

In summary, the invention has the following aspects: In order to be able to provide the semiconductor chips, which are becoming increasingly smaller with the progress of miniaturization, and whose external contacts (e.g. contact bumps or the like for what are known as ball grid arrays) continue to remain the same size, with a reliable rewiring, the contact terminal pads on the rewiring plane must have a certain minimum size. Otherwise, it is difficult to contact the bonds, which can lead to a declining reliability of the contacts. The higher-density semiconductor chips require more conductive tracks inside the rewiring plane. In order to make sufficient space available for them, the contact surfaces of the semiconductor chip can be arranged in only one row (what is known as a single pad row), and the bond channel can be accordingly constructed narrowly.

In order to be able to construct sufficiently large contact terminal pads of the rewiring structure, the contact surfaces of the semiconductor chip are inventively arranged in one or two rows by section, i.e. in a combination of single and double pad rows. In non-critical regions where there is sufficient space available for placing the contact terminal pads, i.e. in central regions, the contact surfaces are arranged in two rows. This way, a large number of bond connections can be led on a relatively small space. On the other hand, in the extreme regions, the contact surfaces are arranged in only one row. The bond channel can accordingly be constructed narrower, and therefore sufficient area is left between the bond channel and the external contact surfaces (ball landing pads) for accommodating the conductive track structures.

This development does not require modifying the rewiring plate fabrication or the fabrication of the electronic components with semiconductor chips. A miniaturization of chips with suitable housings is possible without changing the technology and without extra costs.

Other features which are considered as characteristic for the invention are set forth in the appended claims.

Although the invention is illustrated and described herein as embodied in an electronic component with a semiconductor chip and fabrication method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
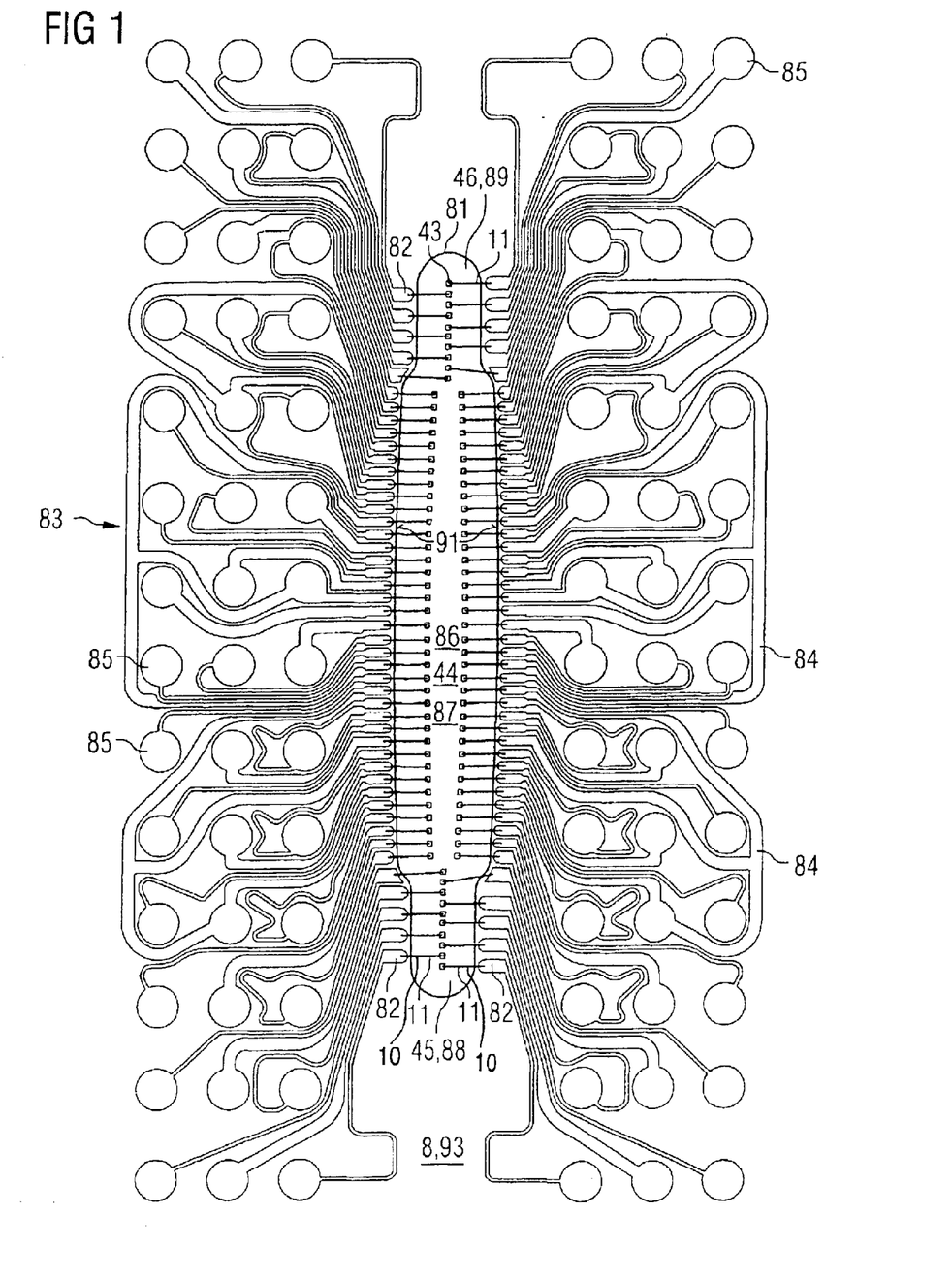
FIG. 1 is a bottom view of a first embodiment of an inventive electronic component.

Referring now to the figures of the drawing in detail and first, particularly, to FIG. 1 thereof, there is shown a schematic bottom view of a first embodiment of an electronic component that does not have a plastic covering on a through-hole 81 for a bond channel 86. The bottom side of the electronic component 2 is formed by a rewiring plate 8 (See FIG. 8), whose outer boundary or edges are not represented for viewing purposes. An active front side 41 of a semiconductor chip 4 can be seen in FIG. 1 in the region of the through-hole 81. This through-hole 81 has been installed in the rewiring plate 8, but has not yet been covered by a plastic covering, for easier viewing. The arrangement of contact surfaces 43 of the semiconductor chip 4 is thus visible on the active front side 41 in the through-hole 81.

These contact surfaces 43 are microscopic, and so they cannot be detected with the naked eye and have dimensions that can be determined only with a light microscope. These contact surfaces 43 in the through-hole 81 are connected to contact terminal pads 82 on the bottom side 93 of the rewiring plate 8 by bond connections 10. The contact terminal pads 82 on the rewiring plate 8 also have microscopic dimensions and are connected by rewiring lines 84 to external contact surfaces 85 having macroscopic dimensions (i.e. which can be seen by the naked eye). External contacts, which are omitted from this representation in FIG. 1, can be attached to these external contact surfaces 85.

This view clearly shows the bond channel 86, which is partitioned into three regions 87, 88 and 89, and the contact surfaces 43, which lie partly in two rows and partly in one row. In a middle first portion 44, which corresponds to the first region 87, the contact surfaces 43 lie in two opposite parallel rows. In peripheral second and third portions 45, 46, which correspond to second and third regions 88, 89 of the through-hole 81, the contact surfaces 43 lie in only one row, respectively. The through-hole 81 is narrowed in the second and third regions 88, 89 relative to the middle first region 87, so that the contact terminal pads 82 adjoining the long sides 91 of the through-hole 81 can also be constructed sufficiently large in the second and third regions 88, 89.

In order to achieve sufficiently large contact terminal pads 82 in the top and bottom peripheral region of the through-hole given the described configuration of the external contact surfaces 85 and given the required rewiring lines 84, which occupy a minimum width, the recess is pinched at the ends bounding its longitudinal extent, which makes more space available for sufficiently large contact terminal pads 82.

Figure 2:
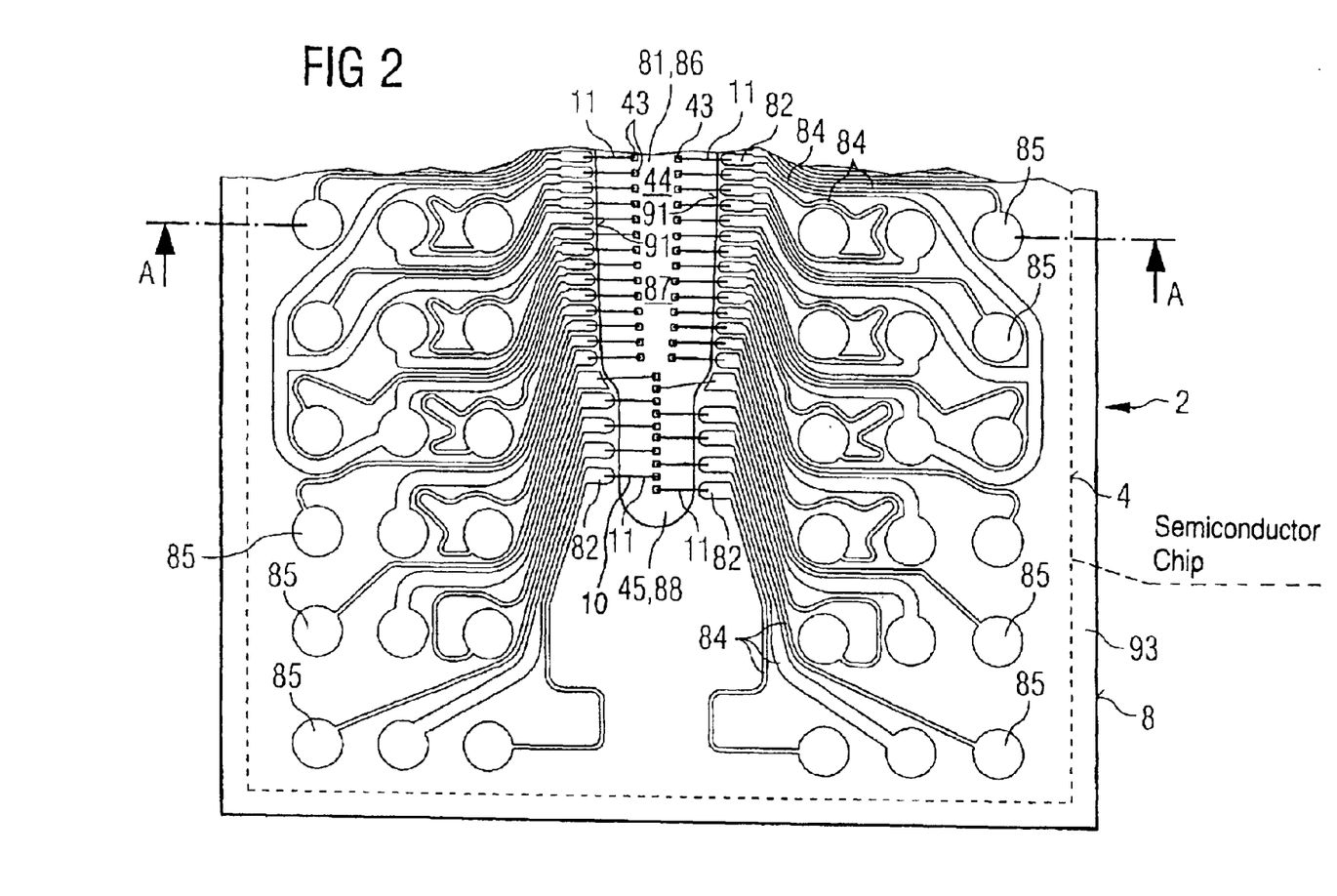
FIG. 2 shows a detailed portion of FIG. 1.

FIG. 2 represents a detailed section of the bottom half of FIG. 1, whereby the semiconductor chip 4 is additionally represented by a dotted line around the rewiring structure. The shape of the contact terminal pads 82 is especially clear in this enlarged view. These are constructed as large in the second region 88 of the through-hole 81 and in the third region 89 (which is not represented) as in the middle first region 89. This is possible only because the through-hole 81 is constructed narrower in the second region 88, and because the contact surfaces 43 in the second portion 45 are arranged in only one row. In the second portion 45 (and the third portion 46, which is not represented), the bond connections 10 lead to contact terminal pads 82 on either side of the bond channel 86 in alternating fashion.

Figure 3:
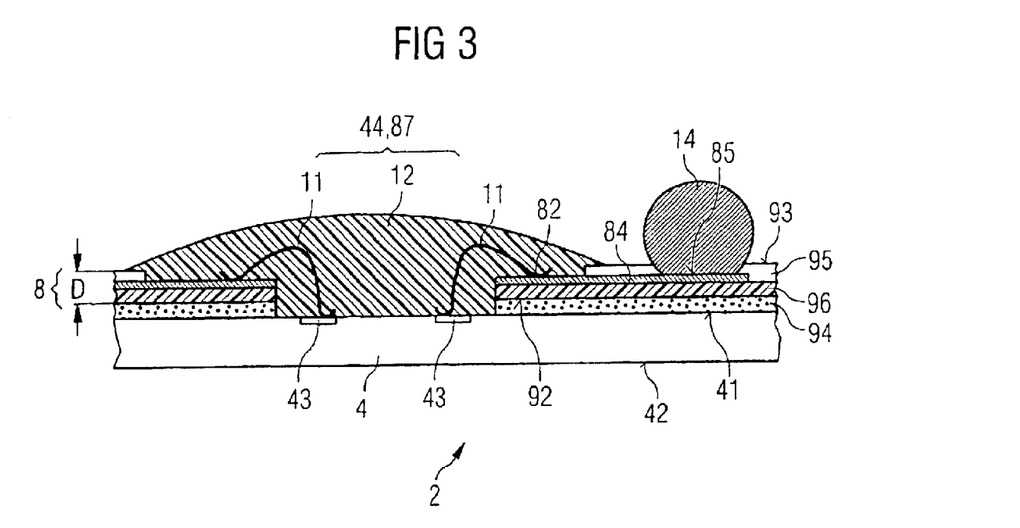
FIG. 3 is a schematic cross-sectional view of the electronic component taken through the section line shown in FIG. 2.

FIG. 3 is a schematic cross-section representing the first embodiment of the electronic component 2 along the line A—A of FIG. 2, but in which a plastic covering 12 has already been provided. Components that perform the same function as in FIGS. 1 and 2 are identified by the same reference characters and are not elaborated upon.

The cross-section in FIG. 3 along the line A—A of FIG. 2 shows the basic concept of an electronic component as a BOC (Board On Chip) component. The bottom side of the electronic component 2 is simultaneously the bottom side 93 of the rewiring plate 8, which consists of three layers, namely a fiber-reinforced plastic plate 96, a structured copper laminate in the form of a rewiring plane 83, and a structured solder resist layer 95.

The structured copper laminate in the form of the rewiring plane 83 includes contact terminal pads 82, rewiring lines 84 and external contact surfaces 85, as already represented in FIGS. 1 and 2. The structured solder resist layer 95 leaves the external contact surfaces 85 and the contact terminal pads 82 clear, so that an external contact 14 can be installed on the external contact surfaces 85 as a contact ball or contact bump. Bond connections 10 in the form of bond wires 11 can be installed on the exposed contact terminal pads 82, which wires connect the contact terminal pads 82 to contact surfaces 43 on the active front side 41 of the semiconductor chip 4. The plastic covering 12 protects the bond wires 11 from mechanical and corrosive damage. In this embodiment of the invention, the external contact 14 is higher than the plastic covering 12 in order to guarantee that the external contact 14 has a sufficient over-elevation beyond the bottom side of the electronic component for giving contact.

Figure 4:
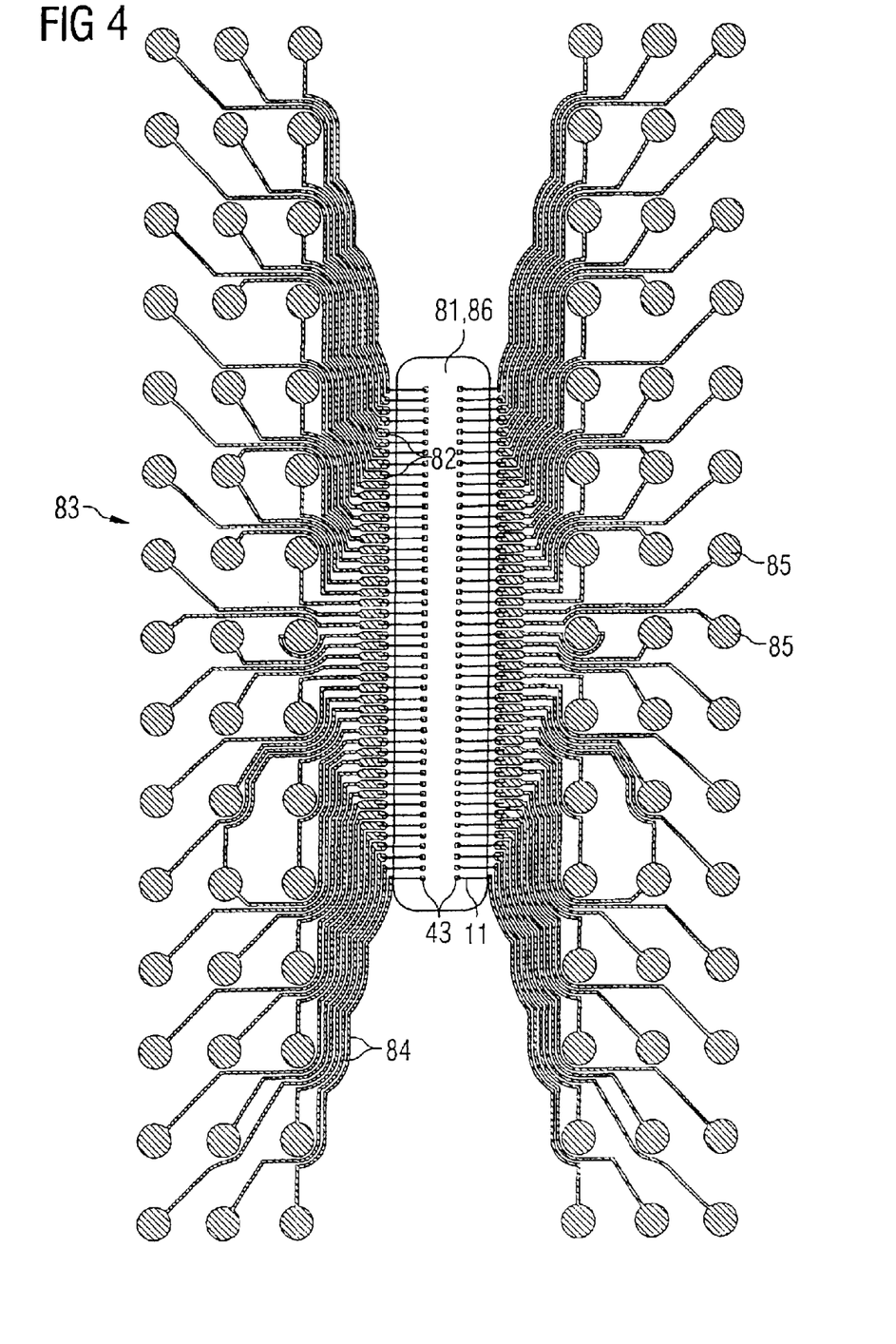
FIG. 4 shows an alternate embodiment of the inventive electronic component.

FIG. 4 represents an alternative embodiment of the rewiring plane 83, in which the contact terminal pads 82 at the extreme edges of the long sides 91 of the through-hole 81 are so small that reliable contacting using bond wires may already be problematic. The contact surfaces 43 of the semiconductor chip 4 are arranged in two parallel rows, so that the through-hole 81 must have a uniform width over its entire length. For this reason, given placement of the external contact surfaces 85 as above, and given the mandatory minimum widths of the rewiring lines, very little space is available in the edge regions of the through-hole 81 for contact terminal pads 82.

Figure 5:
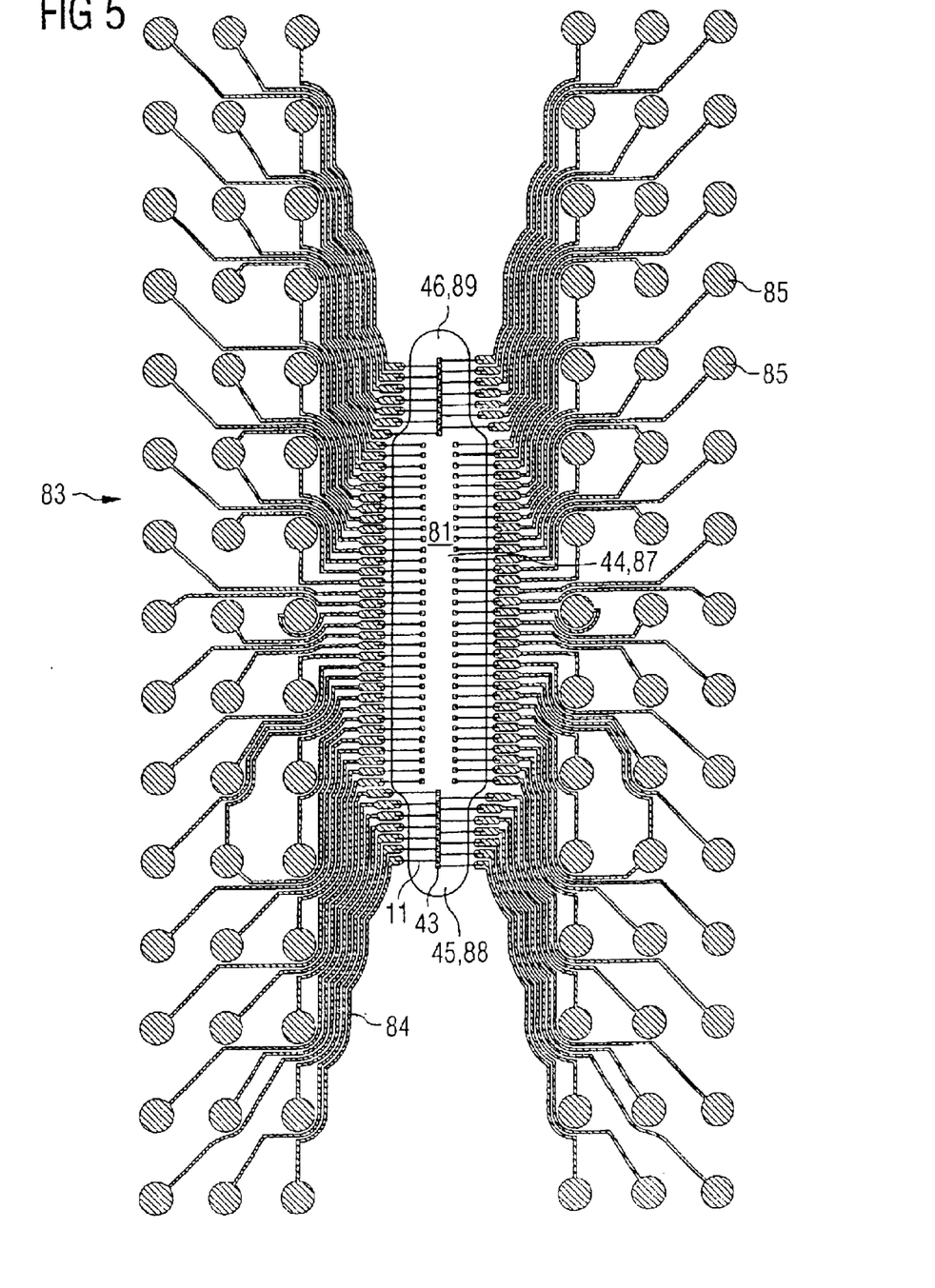
FIG. 5 shows another embodiment of the inventive electronic component.

FIG. 5 represents an alternative arrangement of the rewiring plane 83, which has identically positioned external contact surfaces 85 as those in the embodiment shown in FIG. 4. However, the contact surfaces 43 of the semiconductor chip 4 are constructed in two parallel rows only in a middle first portion 44. On the other hand, in peripheral second and third portions 45, 46, the contact surfaces 43 are constructed in one row, which makes possible a more narrowly constructed through-hole 81 in these second and third regions 88, 89. The hole therefore leaves more space for contact terminal pads 82, which are accordingly constructed larger. This way, a reliable contacting using bond wires 11 for the electrical connection between the contact terminal pads 82 and the contact surfaces 43 is always possible.

Thus, a miniaturization of semiconductor chips with suitable housings is also possible without changing the technology. The fabrication process for the substrate is not changed either.

Unlike the embodiments represented in the FIGS. 1 to 5, in an alternative development of the invention, the contact surfaces 43 in the central first portion 44 extend in only one row. It is also possible to lead the contact surfaces 43 in the peripheral second and third portions 45, 46 in two parallel rows. The through-hole 81 is then wider in the second and third regions 88, 89 than in the first region 87, accordingly.

A method is provided for fabricating the electronic component 2 having a semiconductor chip 4, which has an active front side 41 and semiconductor structures, on a rewiring plate 8. The semiconductor chip 4 is fastened on the rewiring plate 8. The rewiring plate 8 includes an oblong through-hole 81 for bond connections 10 between contact surfaces 43 on the active front side 41 and contact terminal pads 82 on a rewiring plane 83 of the rewiring plate 8. The rewiring plane 83 faces away from the semiconductor chip 4. The contact surfaces 43 extend in two parallel rows in a central first portion 44 and in one row in peripheral second and third portions 45 and 46. The method includes the following steps: Upon providing a semiconductor chip 4 with contact surfaces 43 on its active front side 41, which includes semiconductor structures, a rewiring plate 8 is provided with an oblong through-hole 81 that forms a bond channel 86 and with a rewiring plane 83 consisting of contact terminal pads 82, rewiring lines 84, and external contact surfaces 85.

The semiconductor chip 4 is fastened on the rewiring plate 8, with the contact surfaces 43 of the semiconductor chip 4 being positioned in the through-hole 81 of the rewiring plate 8. Next, bond connections 10 are produced between the contact surfaces 43 on the semiconductor chip 4 and the contact terminal pads 82 on the rewiring plate 8. Lastly, the through-hole 81 is filled with a plastic compound 12, leaving the bond connections 10 embedded.

The bond connections 10 with the bond wires 11 on the long sides 91 of the through-hole 81 are advantageously attached such that approximately uniform wire lengths are maintained.

I claim:

1. An electronic component, comprising:
   a semiconductor chip having an active front side with semiconductor structures and contact surfaces;
   a rewiring plate having a rewiring plane with contact terminal pads; and
   bond connections between said contact surfaces on said active front side and said contact terminal pads;
   said rewiring plane facing away from said semiconductor chip;
   said rewiring plate formed with an oblong through-hole for receiving said bond connections;
   said through-hole having a first portion in which said contact surfaces extend in two parallel rows;
   said through-hole having a second portion in which said contact surfaces extend in one row;
   said through-hole having a third portion in which said contact surfaces extends in one row;
   said through-hole in said rewiring plate having an oblong contour and being formed with a central first region, a peripheral second region, and a peripheral third region;
   said central first region of said through-hole corresponding to said first portion;
   said peripheral second region of said through-hole corresponding to said second portion;
   said peripheral third region of said through-hole corresponding to said third portion; and
   said through-hole being formed with a narrowed contour in said second region and in said third region relative to said first region.

2. The electronic component according to claim 1, wherein:
   said semiconductor chip includes side edges and a back side opposite said active front side; and
   said contact surfaces on said active front side have a structure and a configuration to which said through-hole of said rewiring plate is adapted.

3. The electronic component according to claim 1, comprising:
   external contact surfaces and rewiring lines electrically connecting said contact terminal pads;
   said contact surfaces on said semiconductor chip being electrically connected to said contact terminal pads on said rewiring plate by said bond connections.

4. The electronic component according to claim 1, wherein:
   said through-hole in said rewiring plate is a bond channel.

5. An electronic component, comprising:
   a semiconductor chip having an active front side with semiconductor structures and contact surfaces;
   a rewiring plate having a rewiring plane with contact terminal pads; and
   bond connections between said contact surfaces on said active front side and said contact terminal pads;
   said rewiring plane facing away from said semiconductor chip;
   said rewiring plate formed with an oblong through-hole for receiving said bond connections;
   said through-hole having a first portion in which said contact surfaces extend in two parallel rows;
   said through-hole having a second portion in which said contact surfaces extend in one row;
   said through-hole having a third portion in which said contact surfaces extends in one row;
   said through-hole in said rewiring plate having an oblong contour and being formed with a central first region, a peripheral second region, and a peripheral third region;
   said central first region of said through-hole corresponding to said first portion;
   said peripheral second region of said through-hole corresponding to said second portion;
   said peripheral third region of said through-hole corresponding to said third portion; and
   said through-hole having a narrowed contour in said first region relative to said second region and said third region.

6. The electronic component according to claim 1, wherein:
   said through-hole defines longitudinal sides; and
   said bond connections include bond wires with approximately uniform wire lengths crossing said longitudinal sides of said through-hole.

7. The electronic component according to claim 1, wherein:
said through-hole defines longitudinal sides;
each one of said contact terminal pads adjoins a respective one of said longitudinal sides of said through-hole; and
said contact terminal pads have approximately equal area dimensions.

8. The electronic component according to claim 1, wherein:
said rewiring plate has a thickness between 150 μm and 300 μm.

9. The electronic component according to claim 1, wherein:
said rewiring plate includes fiber-reinforced plastic with a metal laminate that is structured into rewiring lines, external contact surfaces, and said contact terminal pads.

10. The electronic component according to claim 9, wherein:
said metal laminate includes a material selected from a group consisting of copper and a copper alloy.

11. The electronic component according to claim 1, comprising:
external contact surfaces electrically connected to said contact terminal pads;
said contact terminal pads and said external contact surfaces each including a coating; and
said coating being a connectable coating selected from a group consisting of a solderable coating and a bondable coating.

12. A method for fabricating an electronic component, which comprises:
providing a semiconductor chip having an active front side with semiconductor structures and contact surfaces configured such that a first portion of the contact surfaces extend in two parallel rows, a second portion of the contact surfaces extend in one row and a third portion of the contact surfaces extend in one row;
providing a rewiring plate with an oblong through-hole forming a bond channel and with a rewiring plane facing away from the semiconductor chip, the oblong through-hole having an oblong contour and being formed with a central first region corresponding to the first portion, a peripheral second region corresponding to the second portion, and a peripheral third region corresponding to the third portion, the through-hole being formed with a narrowed contour in the second and third regions relative to the first region;
providing the rewiring plane with contact terminal pads, rewiring lines, and external contact surfaces;
fastening the semiconductor chip on the rewiring plate, such that the contact surfaces of the semiconductor chip are positioned in the through-hole of the rewiring plate;
producing bond connections between the contact surfaces on the semiconductor chip and the contact terminal pads on the rewiring plate; and
filling the through-hole with a plastic compound to embed the bond connections.

13. The method according to claim 12, which comprises:
providing the bond connections with bond wires that cross longitudinal sides of the through-hole and providing the bond wires with approximately uniform wire lengths.

14. The electronic component according to claim 1, wherein:

said through-hole has a first portion in which said contact surfaces extend in one row;
said through-hole has a second portion in which said contact surfaces extend in two rows; and
said through-hole has a third portion in which said contact surfaces extend in two rows.

15. The electronic component according to claim 5, wherein:
said through-hole has a first portion in which said contact surfaces extend in one row;
said through-hole has a second portion in which said contact surfaces extend in two rows; and
said through-hole has a third portion in which said contact surfaces extend in two rows.

16. The electronic component according to claim 5, wherein:
said semiconductor chip includes side edges and a back side opposite said active front side; and
said contact surfaces on said active front side have a structure and a configuration to which said through-hole of said rewiring plate is adapted.

17. The electronic component according to claim 5, further comprising:
external contact surfaces and rewiring lines electrically connecting said contact terminal pads;
said contact surfaces on said semiconductor chip being electrically connected to said contact terminal pads on said rewiring plate by said bond connections.

18. The electronic component according to claim 5, wherein:
said through-hole in said rewiring plate is a bond channel.

19. The electronic component according to claim 5, wherein:
said through-hole defines longitudinal sides; and
said bond connections include bond wires with approximately uniform wire lengths crossing said longitudinal sides of said through-hole.

20. The electronic component according to claim 5, wherein:
said through-hole defines longitudinal sides;
each one of said contact terminal pads adjoins a respective one of said longitudinal sides of said through-hole; and
said contact terminal pads have approximately equal area dimensions.

21. The electronic component according to claim 5, wherein:
said rewiring plate has a thickness between 150 μm and 300 μm.

22. The electronic component according to claim 5, wherein:
said rewiring plate includes fiber-reinforced plastic with a metal laminate structured into rewiring lines, external contact surfaces, and said contact terminal pads.

23. The electronic component according to claim 22, wherein:
said metal laminate includes a material selected from a group consisting of copper and a copper alloy.

24. The electronic component according to claim 5, further comprising:
external contact surfaces electrically connected to said contact terminal pads;
said contact terminal pads and said external contact surfaces each including a coating; and said coating being a connectable coating selected from a group consisting of a solderable coating and a bondable coating.

25. A method for fabricating an electronic component, which comprises:

providing a semiconductor chip having an active front side with semiconductor structures and contact surfaces configured such that a first portion of the contact surfaces extend in two parallel rows, a second portion of the contact surfaces extend in one row and a third portion of the contact surfaces extend in one row;

providing a rewiring plate with an oblong through-hole forming a bond channel and with a rewiring plane facing away from the semiconductor chip, the oblong through-hole having an oblong contour and being formed with a central first region corresponding to the first portion, a peripheral second region corresponding to the second portion, and a peripheral third region corresponding to the third portion, the through-hole having a narrowed contour in the first region relative to the second and third regions;

providing the rewiring plane with contact terminal pads, rewiring lines, and external contact surfaces;

fastening the semiconductor chip on the rewiring plate, such that the contact surfaces of the semiconductor chip are positioned in the through-hole of the rewiring plate;

producing bond connections between the contact surfaces on the semiconductor chip and the contact terminal pads on the rewiring plate; and filling the through-hole with a plastic compound to embed the bond connections.

* * * * *